United States Patent
Gupta et al.

(10) Patent No.: US 10,033,376 B2
(45) Date of Patent: Jul. 24, 2018

(54) POWER-ON-RESET CIRCUIT

(71) Applicant: ARM Limited, Cambridge (GB)

(72) Inventors: Lalit Gupta, Cupertino, CA (US);
Vivek Nautiyal, Milpitas, CA (US);
Andy Wangkun Chen, Austin, TX (US); Jitendra Dasani, Cupertino, CA (US); Bo Zheng, Cupertino, CA (US);
Akshay Kumar, New Delhi (IN);
Vivek Asthana, Greater Noida (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/143,197

(22) Filed: Apr. 29, 2016

(65) Prior Publication Data
US 2017/0317672 A1   Nov. 2, 2017

(51) Int. Cl.
*H03L 7/00* (2006.01)
*H03K 17/22* (2006.01)
*G11C 5/14* (2006.01)

(52) U.S. Cl.
CPC .......... *H03K 17/223* (2013.01); *G11C 5/148* (2013.01)

(58) Field of Classification Search
CPC .................................................. H03K 17/223
See application file for complete search history.

(56) References Cited

U.S. PATENT DOCUMENTS

| | | | |
|---|---|---|---|
| 5,625,309 A * | 4/1997 | Fucili | H03K 3/037 326/46 |
| 5,739,708 A * | 4/1998 | LeWalter | G06F 1/04 327/142 |
| 2011/0084740 A1* | 4/2011 | Kawamura | H03K 17/223 327/143 |
| 2012/0161840 A1* | 6/2012 | Kojima | H03K 3/0375 327/184 |

* cited by examiner

*Primary Examiner* — Daniel Puentes
(74) *Attorney, Agent, or Firm* — Pramudji Law Group PLLC; Ari Pramudji

(57) ABSTRACT

Various implementations described herein are directed to a circuit. The circuit may include a memory circuit having a first latch. The circuit may include a power-on-reset circuit having a second latch coupled to the first latch. The second latch may be configured to reset the first latch to a predetermined state at power-up.

16 Claims, 10 Drawing Sheets

POWER-ON-RESET CIRCUIT

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits may be configured as memory circuits to store and access data. Some integrated circuits include circuitry to perform monitoring functions to assist with detecting whether a power supply has reached safe levels. Sometimes, integrated circuits are subject to current surges, and protection may be achieved with a type of circuit known as a power-on-reset (POR) circuit.

FIG. 1 shows a diagram of a conventional POR circuit 100 having a resistor-capacitor (RC) circuit 110 and a delay circuit 112. The RC circuit 110 typically includes a resistor R and a capacitor C arranged to provide an RC signal at an output node N, and the delay circuit 112 typically includes multiple inventors arranged in series to provide a delay stage to the RC signal. In this circuit 100, the delayed output signal may be referred to as a POR reset signal or reset pulse signal.

Unfortunately, this conventional POR circuit 100 is deficient. For instance, to have a high pulse that is sufficient to latch correctly, the size of the resistor R and capacitor C in the RC circuit should be substantially large, and hence, deficiencies can arise in a high cost of area. Further, the delay circuit 112 typically suffers from variability and also uses a large area to provide a substantial delay at slow supply ramp. As such, implementation of a substantially large circuit is not a viable solution in some cases, and the conventional approach is susceptible to failure with device variations. Further, in some situations, the conventional approach is not robust enough to generate reset under PVT (pressure, voltage, and temperature) variations.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to a robust power-on-reset (POR) circuit configured to reset a latch, such as, e.g., a NOR SR latch, to a predetermined state at time of power up. The POR circuit may refer to a low-power, area-optimized circuit to set and/or reset a NOR SR latch at power-up. In some cases, due to an inherent speed advantage of the NOR SR latch, designers may use the NOR SR latch for speed critical paths. However, since the NOR SR latch involves use of a high voltage signal to be reset, the NOR SR latch may involve use of a substantially large POR circuit, which may introduce a timing race between a reset operation of the NOR SR latch and a timing delay in the POR circuit. To overcome deficiencies of standard POR circuits, the POR circuit of the present disclose uses various improved techniques to reset a latch, such as, e.g., a NOR SR latch, to a predetermined state at time of power up.

Various implementations of a POR circuit will now be described in greater detail herein with reference to FIGS. 2A-4.

Figure 1:
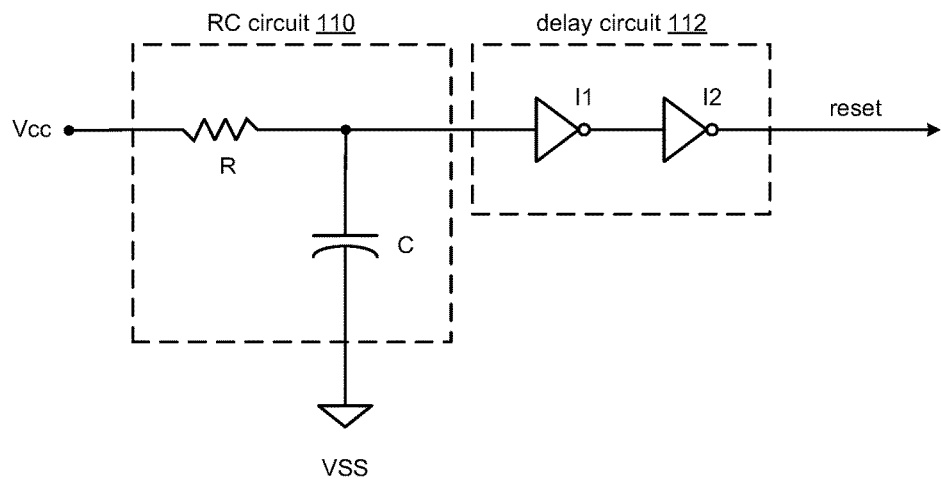
FIG. 1 illustrates a conventional POR circuit as known in the art.
Figure 2A:
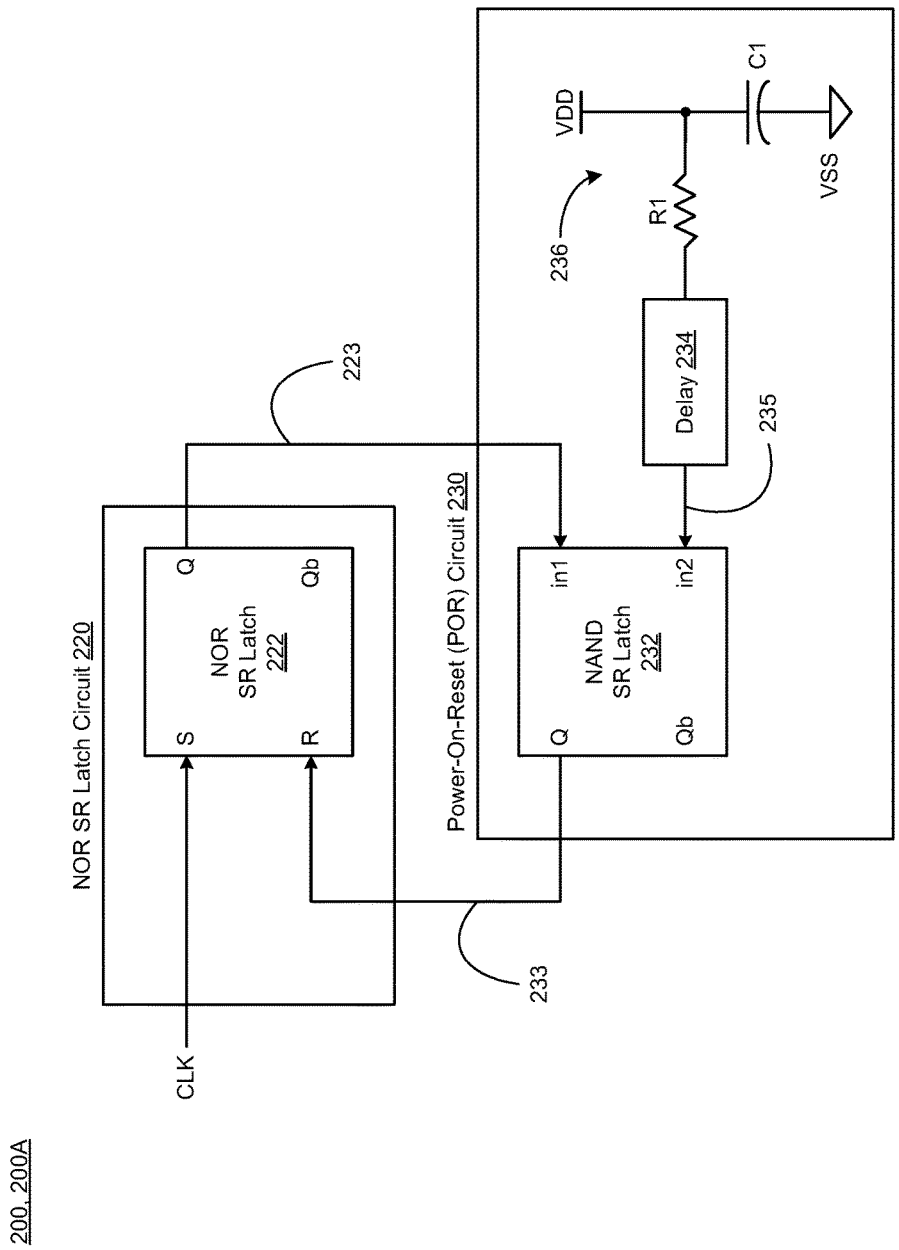
FIGS. 2A-2D illustrate various diagrams of a POR circuit in accordance with various implementations described herein.
Figure 2B:
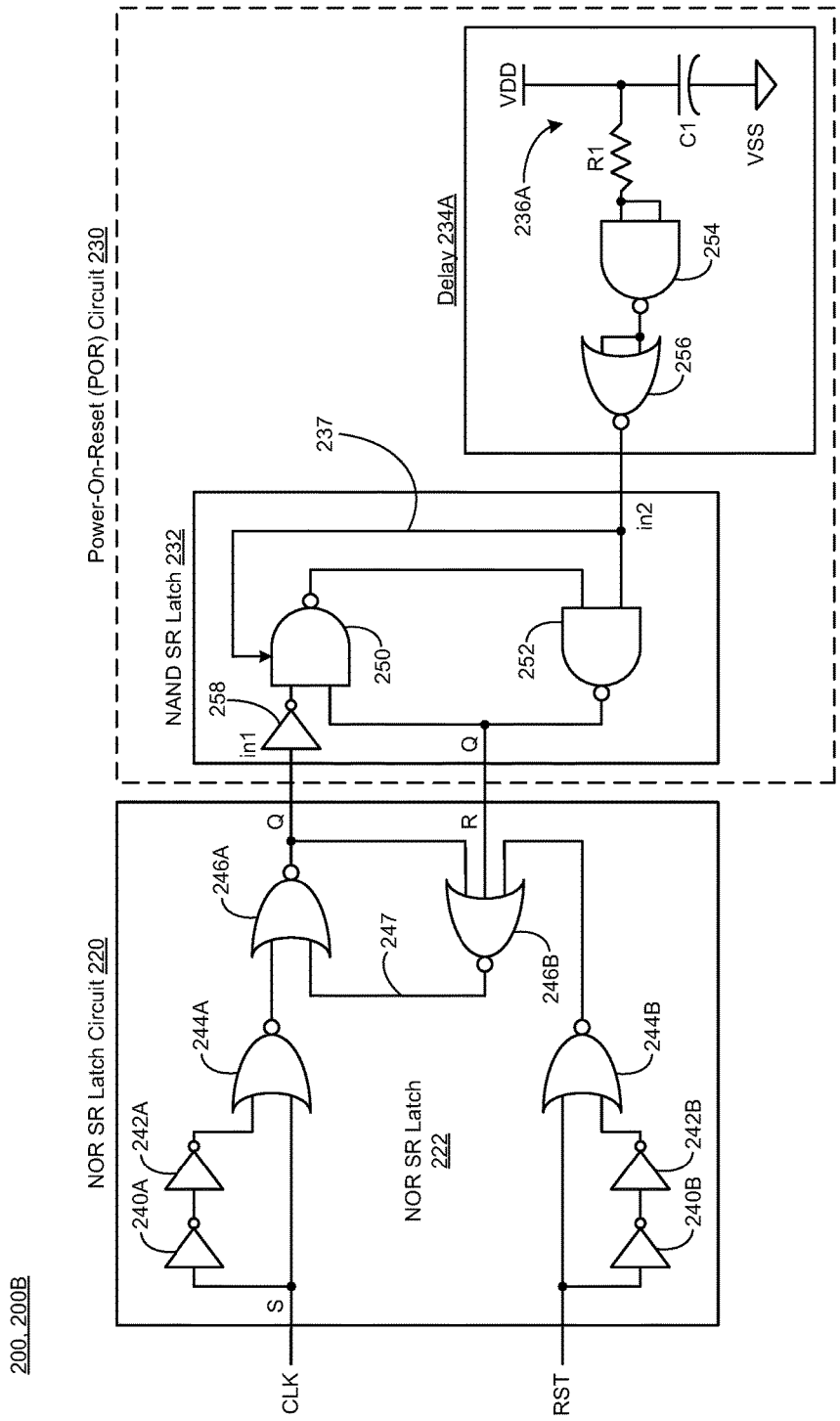
Figure 2C:
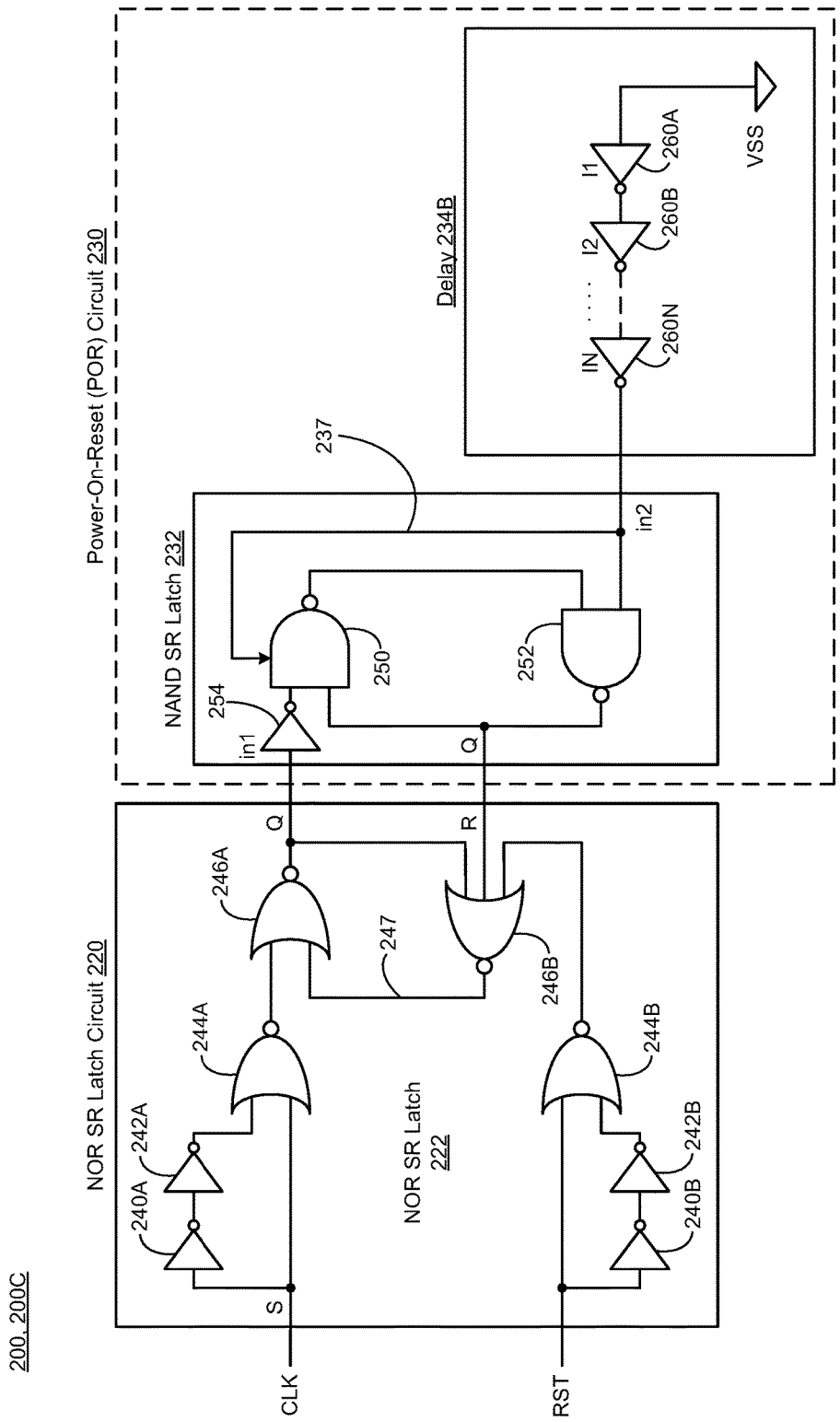
Figure 2D:
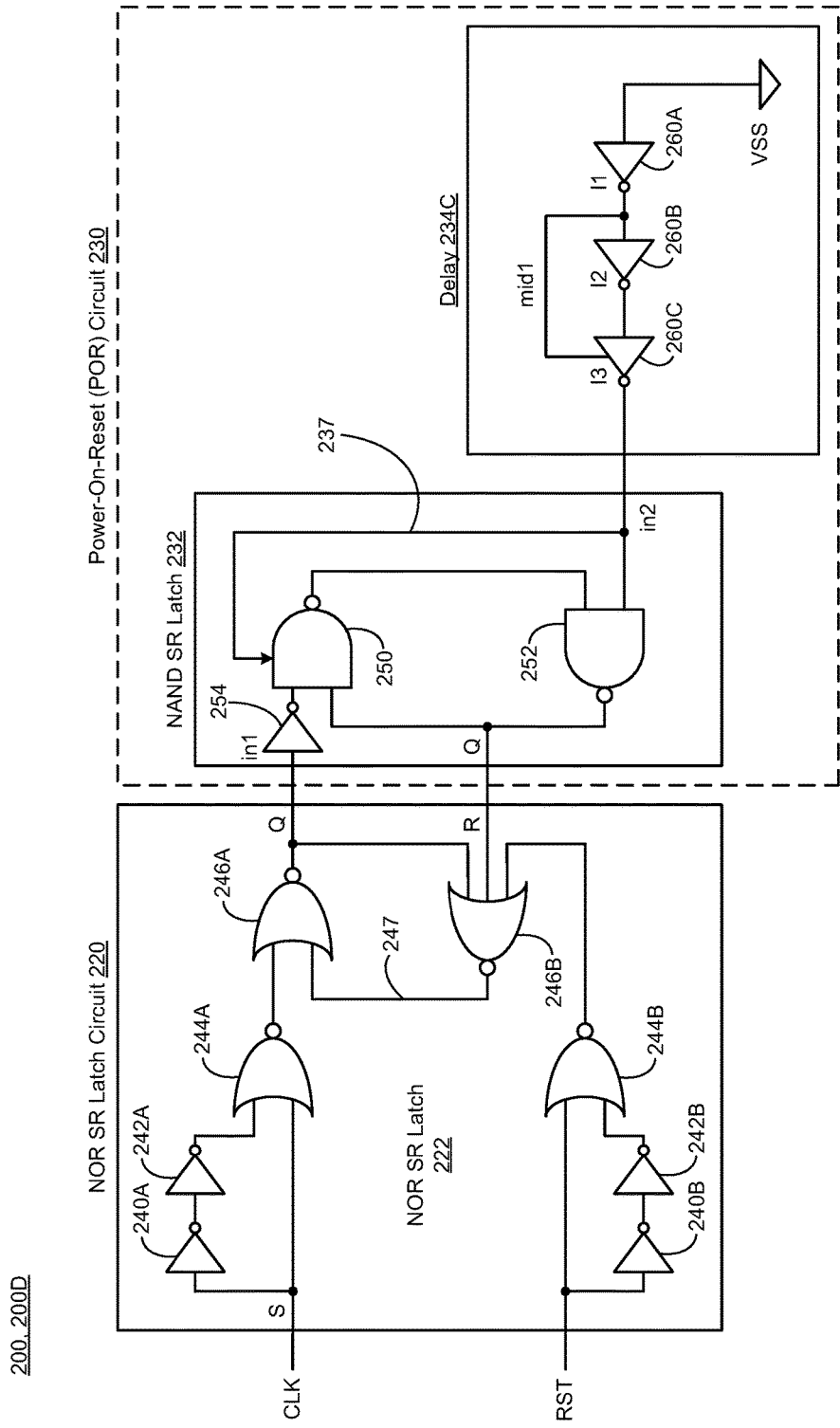

FIGS. 2A-2D illustrate various diagrams of a power-on-reset (POR) circuit in accordance with implementations described herein. In particular, FIG. 2A illustrates a block diagram 200A of a circuit 200 having a NOR SR latch circuit 220 and a POR circuit 230, FIG. 2B illustrates a detailed schematic diagram 200B of the circuit 200 having the NOR SR latch circuit 220 and the POR circuit 230 with a first delay 234A, and FIG. 2C illustrates another detailed schematic diagram 200C of the circuit 200 having the NOR SR latch circuit 220 and the POR circuit 230 with a second delay 234B. Further, FIG. 2D illustrates another detailed schematic diagram 200D of the circuit 200 having the NOR SR latch circuit 220 and the POR circuit 230 with a third delay 234C implemented with multiple inverters, such as, e.g., three (3) inverters.

In reference to FIG. 2A, the circuit 200 may include the NOR SR latch circuit 220 and the POR circuit 230. The circuit 200 may be implemented as a memory circuit having a first latch, such as, e.g., a NOR SR latch 222. The POR circuit 230 may include a second latch, such as, e.g., a NAND SR latch 232, coupled to the first latch (i.e., NOR SR latch 222). The second latch (i.e., NAND SR latch 232) may be configured to reset the first latch (i.e., NOR SR latch 222) to a predetermined state at power-up, which refers to a time period for activation of the circuit 200 during ramp of a supply voltage VDD.

In some implementations, the POR reset technique described herein refers to setting a NAND latch at power-up and then using the latched signal from the NAND latch to reset a NOR latch. Hence, this POR reset technique subsequently flushes the NAND latch through a handshake signal once the NOR latch is reset to a desired state. As such, this POR reset technique uses a feedback mechanism of one latch to set/reset another latch, which is described in greater detail herein below.

In some implementations, a clock signal CLK may be provided to an S input of the NOR SR latch 222, and a control signal 233 may be provided from the NAND SR latch 232 to an R input of the NOR SR latch 222. The control signal 233 is a latched set signal of the NAND SR latch 232 that is used to reset the NOR SR latch 222. The control signal 233 may be a Q signal from the NAND SR latch 232. In some cases, the control signal 233 (or Q signal) may be a power-up pulse to reset the state of the NOR SR latch 222 to logical zero (e.g., 0V). As such, the predetermined state of the NOR SR latch 222 may refer to a state of logical zero (e.g., 0V). In some cases, the control signal 233 may refer to a latched signal Q (which may be referred to as a pwreset signal) from the NAND SR latch 232, and the latched signal from the NAND SR latch 232 is provided for latching the NOR SR latch 222 in a manner so as to be independent of logic delay from the delay 234 and RC circuit 236.

Further, in some cases, the NOR SR latch 222 may be configured to provide a Q signal 223 to a first input (in1) of the NAND SR latch 232 as a handshake signal to indicate that the NOR SR latch 222 is reset. In this manner, the Q signal 223 may be used as a handshake signal to reset the NAND SR latch 232 when (or after) the NOR SR latch 222 has been set. Generally, for gate type devices, the S input is a set input, and the R input is a reset input.

In some implementations, the POR circuit 230 may include a delay 234 (delay circuit or delay component). The delay circuit 234 may be configured to provide a delayed control signal 235 to a second input (in2) of the NAND SR latch 232, e.g., to ensure that resetting of the NAND SR latch 232 is delayed by a predetermined period of time. The delayed control signal 235 may be referred to as a delayed VDD signal (vdd_delay) provided by the delay 234. In some cases, the POR circuit 230 may include an RC circuit 236 having a resistor R1 and a capacitor C1 arranged to provide an RC signal to the delay 234. The capacitor C1 may be coupled between a first voltage source VDD (e.g., first supply bus) and a second voltage source VSS (e.g., second supply bus). The first voltage source VDD may be referred to as an input voltage or input signal, and the second voltage source VSS may be referred to as a ground voltage or ground signal (GND).

In reference to FIG. 2B, the NOR SR latch 222 of the NOR SR latch circuit 220 may include various components, including multiple inverters and NOR gates. For instance, the NOR SR latch 222 may include a first stage of inverters 240A, 242A and a first NOR gate 244A arranged to receive the clock signal CLK and provide an output signal to a second NOR gate 246A. The second NOR gate 246A also receives an output signal from a fourth NOR gate 246B. Based on the received signals, the second NOR gate 246A is configured to output a Q signal to the NAND SR latch 232 of the POR circuit 230. Further, the NOR SR latch 222 may include a second stage of inverters 240B, 242B and a third NOR gate 244B arranged to receive a reset signal RST and provide an output signal to the fourth NOR gate 246B. As such, the fourth NOR gate 246B is configured to receive the output signal from the third NOR gate 244B, the Q signal from the second NOR gate 246A, and an output signal (i.e., Q signal) from the NAND SR latch 232. The output signal (or Q signal) from the NAND SR latch 232 is received by the NOR SR latch 222 at the R input thereof. Based on the received signals, the fourth NOR gate 246B is configured to provide an output signal to the second NOR gate 246A.

In some implementations, the first delay 234A may include the resistor R1, the capacitor C1, and multiple gates, such as, e.g., a NAND gate 254, and a NOR gate 256, that are arranged to provide one or more inversions of an RC signal generated by an RC circuit 236A. In this instance, the first delay 234A includes the RC circuit 236A having the resistor R1 and the capacitor C1 arranged to provide the RC signal to the NAND gate 254. Further, as shown, the NAND gate 254 is configured to provide an output signal to the NOR gate 256, and the NOR gate 256 is configured to provide another output signal to the second input (in2) of the NAND SR latch 232. In some cases, the resistor R1, the capacitor C1, and the multiple gates (e.g., the NAND gate 254 and the NOR gate 256) of the first delay 234A are arranged to ensure that resetting of the NAND SR latch 232 is delayed by a predetermined period of time. In some implementations, the first delay 234A may provide an even number of inversions. For instance, in reference to the first delay 234A, the NAND gate 254 (with inputs coupled together) may provide a first inversion of the RC signal, and the NOR gate 256 (with inputs coupled together) may provide a second inversion of the RC signal. In other implementations, other types of circuit components or devices may be used (e.g., invertors or various other types of gates) to provide any number of inversions, including an even number of inversions.

In some implementations, the NAND SR latch 232 of the POR circuit 230 may include various components, including one or more inverters and multiple NAND gates. For instance, the NAND SR latch 232 may include an inverter 258 configured to receive the Q signal from the NOR SR latch 222, invert the Q signal, and provide the inverted Q signal to a first NAND gate 250. Further, the first NAND gate 250 is configured to receive a signal from a second NAND gate 252, and via the second input (in2), the first NAND gate 250 is configured to receive another signal 237 (e.g., as a forward biasing signal) from the first delay 234A. As shown, the forward biasing signal 237 is provided by the NOR gate 256 of the first delay 234A. The forward biasing signal 237 is a delayed control signal (e.g., delayed VDD signal) provided by the first delay 234A to ensure that resetting of the NOR SR latch 222 is delayed by a predetermined period of time. In some cases, the forward biasing signal 237 may be used to provide power to the first NAND gate 250 via a power supply connection of the first NAND gate 250. In some cases, this power supply connection of the first NAND gate 250 may be a power supply connection of the NAND SR latch 232. Based on the received signals, including the forward biasing signal 237, the first NAND gate 250 is configured to provide an output signal to the second NAND gate 252. The second NAND gate 252 is configured to receive a signal from the first NAND gate 250 and receive a signal from the first delay 234A via the second input (in2). Based on the received signals, the second NAND gate 252 is configured to provide an output signal to the first NAND gate 250 and further provide the output signal (i.e., as the Q signal) to the fourth NOR gate 246B of the NOR SR latch 222.

In reference to FIG. 2C, the second delay 234B may include a number of inverters I1, I2, . . . , IN that are arranged to ensure that resetting of the NAND SR latch 232 is delayed by a predetermined period of time. For instance, as shown, the second delay 234B may include one or more inverters 260A, 260B, . . . , 260N that are configured to receive the second voltage source VSS as an input signal, which may be referred to as a ground signal (GND). Further, the inverters 260A, 260B, . . . , 260N may be arranged sequentially (or stacked) in series and may be configured to delay the input signal by the pre-determined period of time (based, e.g., on the number of inverters) and then provide an output signal to the second NAND gate 252 of the NAND SR latch 232 via the second input (in2). Further, as shown, the inverters 260A, 260B, . . . , 260N are configured to provide the forward biasing signal 237 to the first NAND gate 250 of the NAND SR latch 232 via the second input (in2). In some cases, the forward biasing signal 237 may be used to provide power to the first NAND gate 250. Further, in some cases, as described herein, the forward biasing signal 237 is a delayed control signal (e.g., delayed VDD signal) provided by the second delay 234B to ensure that resetting of the NOR SR latch 222 is delayed by a predetermined period of time. In some implementations, the second delay 234B may provide an odd number of inversions. For instance, the second delay 234B may include an odd number of inverters, such as, e.g., three (3) or five (5).

In some other implementations, various other types of circuit components or devices may be used (e.g., various other types of gate devices) to provide any number of inversions, including an odd number of inversions.

In reference to FIG. 2D, the third delay 234C may be implemented with and include a number of inverters, such as, e.g., three (3) inverters I1, I2, I3, that are arranged to ensure that resetting of the NAND SR latch 232 is delayed by a predetermined period of time. For instance, as shown, the third delay 234C may include multiple inverters 260A, 260B, 260C that are configured to receive the second voltage source VSS as an input signal, which may be referred to as a ground signal (GND). Further, the inverters 260A, 260B, 260C may be arranged sequentially (or stacked) in series and may be configured to delay the input signal by the predetermined period of time (based, e.g., on the number of inverters) and then provide an output signal to the second NAND gate 252 of the NAND SR latch 232 via the second input (in2). Further, as shown, the inverters 260A, 260B, 260C are configured to provide the forward biasing signal 237 to the first NAND gate 250 of the NAND SR latch 232 via the second input (in2). In some cases, the forward biasing signal 237 may be used to provide power to the first NAND gate 250. Further, in some cases, as described herein, the forward biasing signal 237 is a delayed control signal (e.g., delayed VDD signal) provided by the second delay 234B to ensure that resetting of the NOR SR latch 222 is delayed by a predetermined period of time.

Further, in some implementations, as shown in FIG. 2D, one or more of the multiple inverters, such as, e.g., a first inverter I1, may be configured to provide another forward biasing signal (e.g., mid1) as a source supply voltage to at least one other inverter, such as, e.g., a third inverter I3, of the multiple inverters. For instance, in some cases, an output voltage of the first inverter I1 may be applied to the third inverter I3 as a forward biasing voltage or signal mid1 for use as, e.g., a power supply connection. Further, in some implementations, the third delay 234C provides an odd number of inversions using an odd number of inverters, such as, e.g., three (3) inverters I1, I2, I3. In some other implementations, various other types of circuit components or devices may be used (e.g., various other types of gate devices) to provide any number of inversions, including an odd number of inversions. Various features related to the forward biasing voltage or signal mid1 is described in greater detail herein below.

FIGS. 3A-3D illustrate various other diagrams of a POR circuit in accordance with various implementations described herein.

Figure 3A:
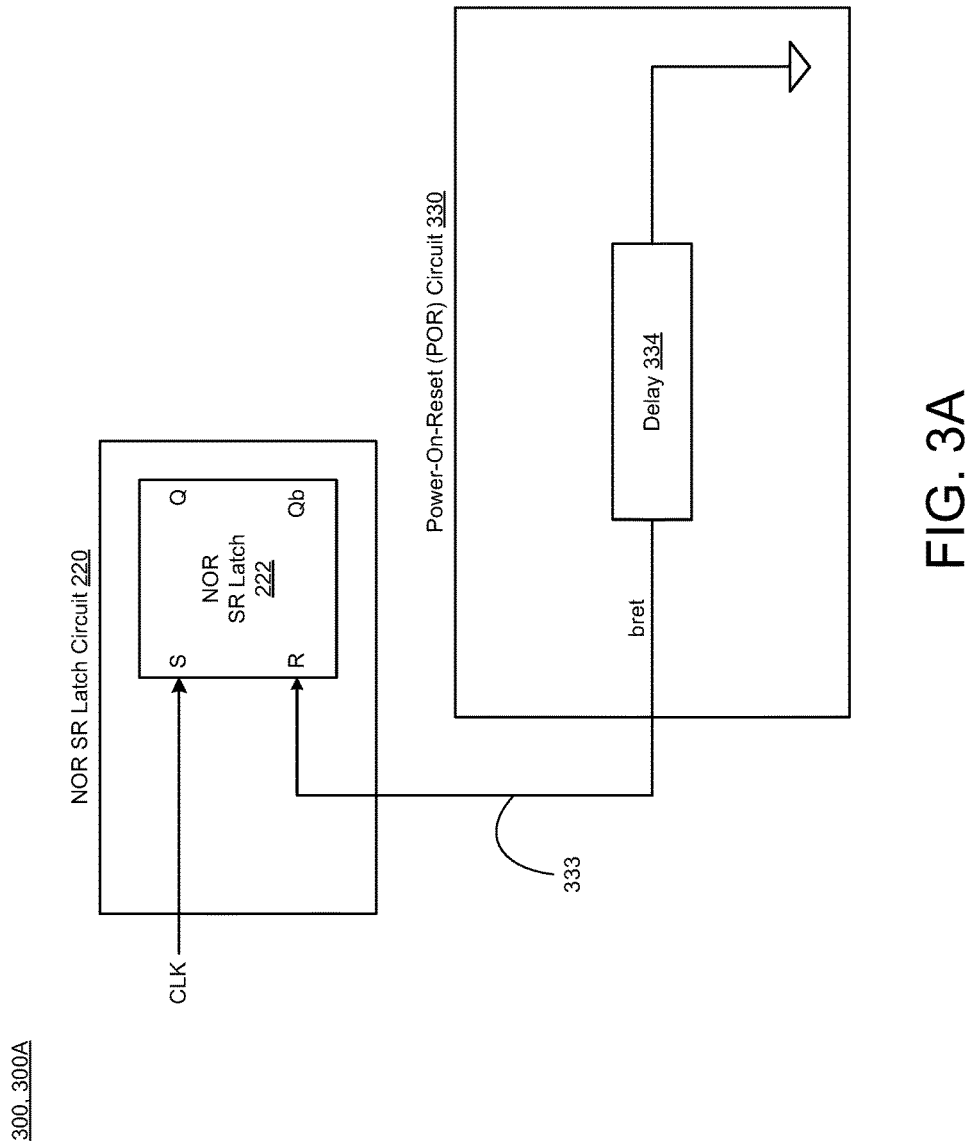
FIGS. 3A-3D illustrate various other diagrams of a POR circuit in accordance with various implementations described herein.
Figure 3B:
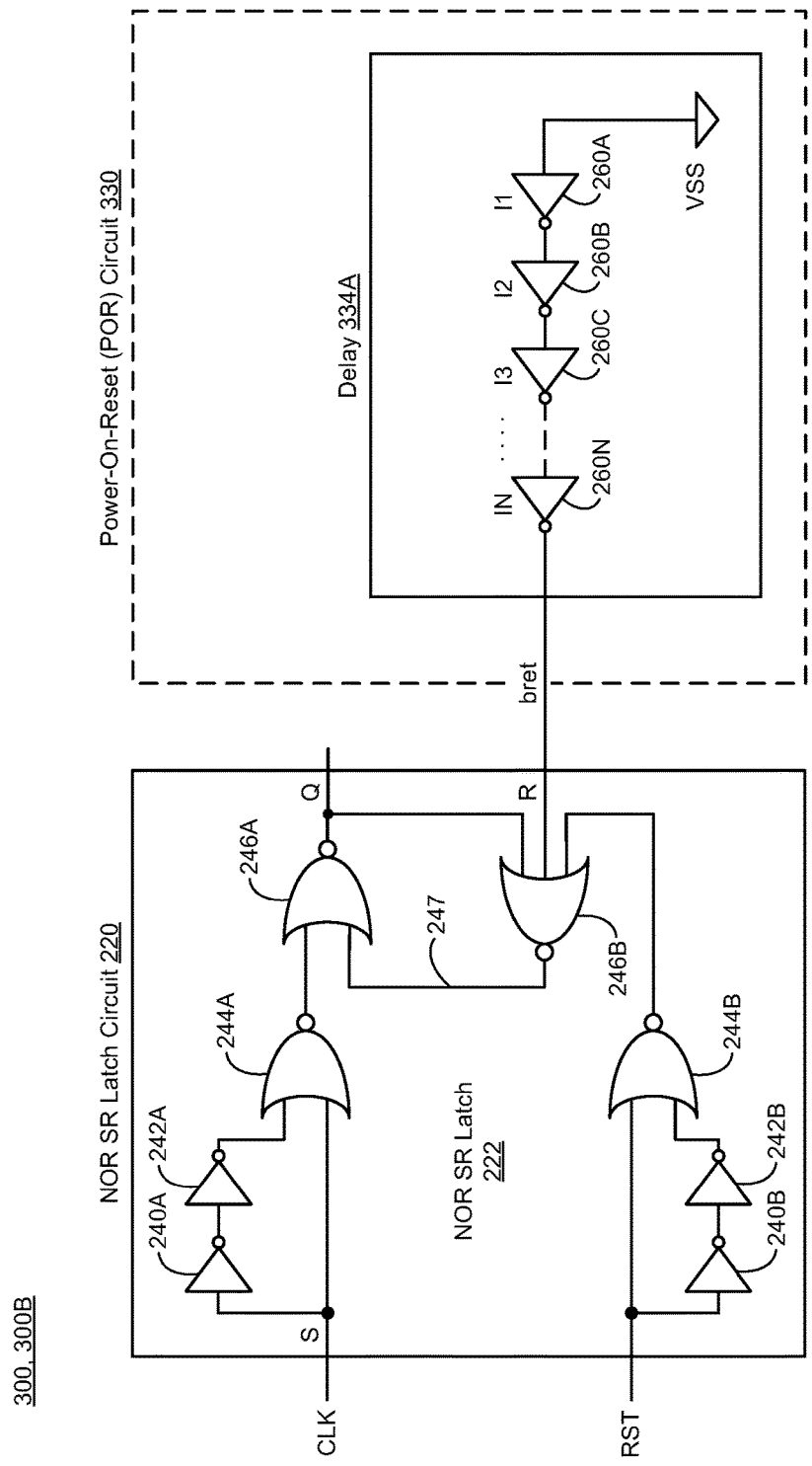
Figure 3C:
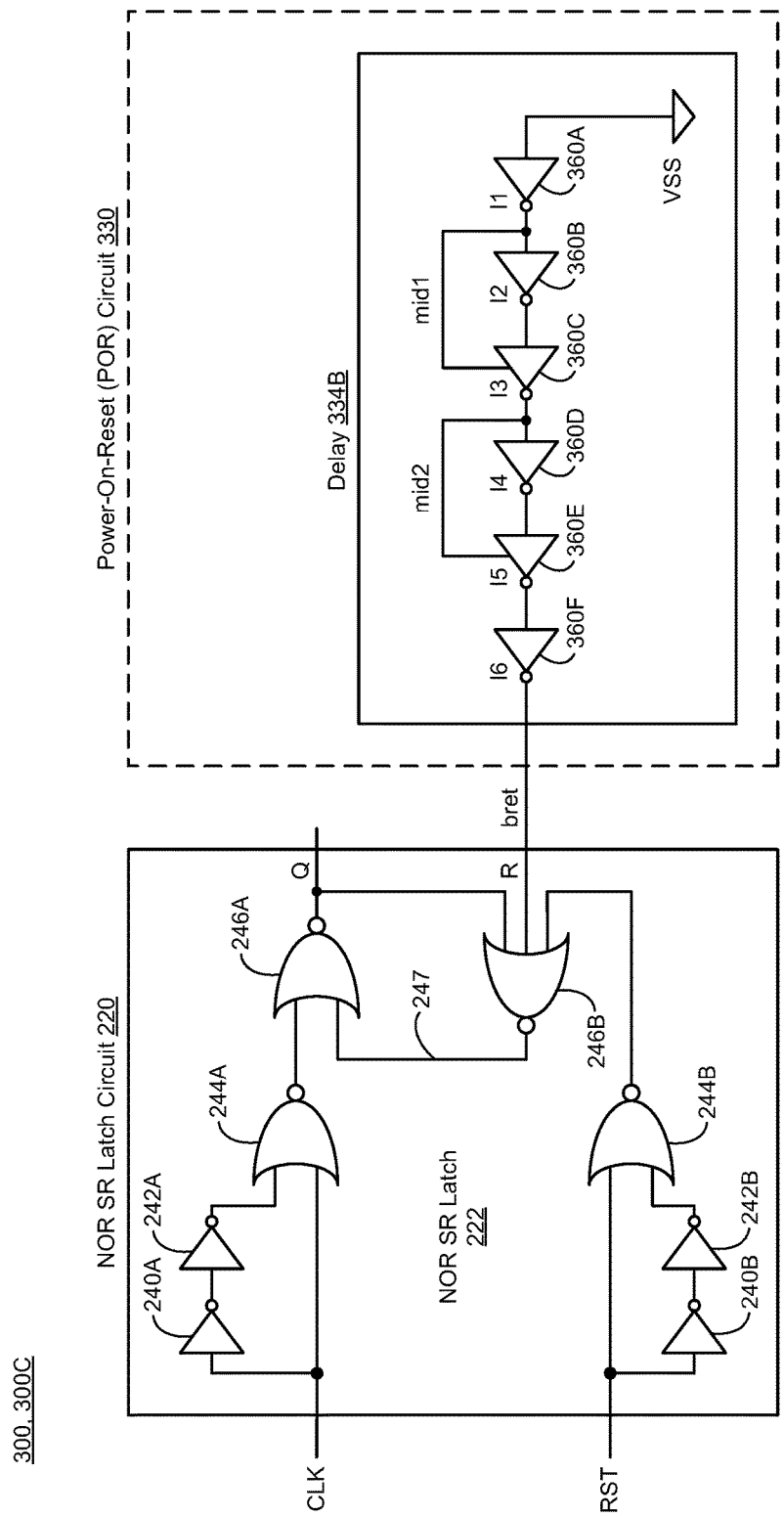
Figure 3D:
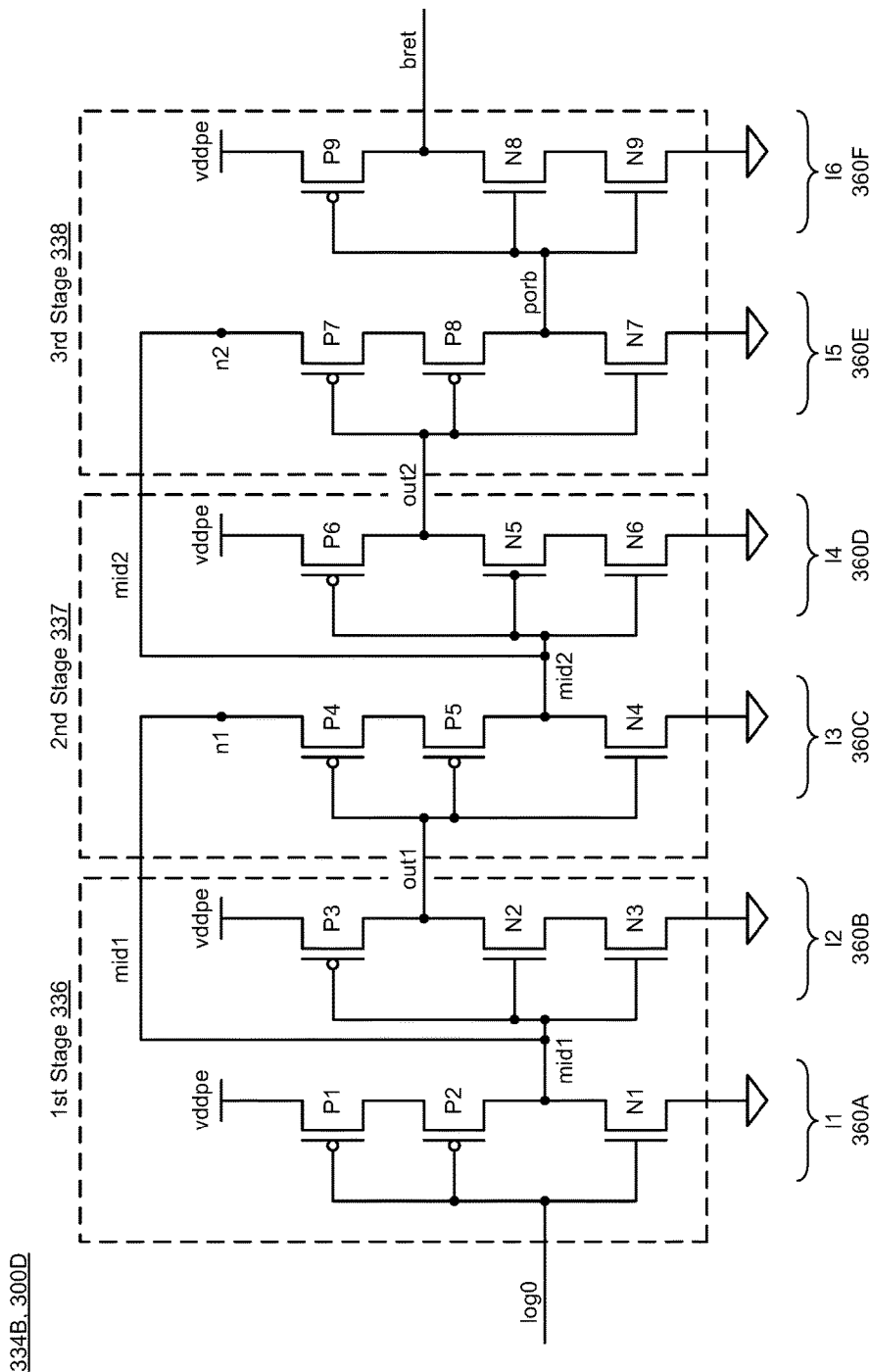

In particular, FIG. 3A illustrates a block diagram 300A of a circuit 300 having the NOR SR latch circuit 220 and another POR circuit 330, FIG. 3B illustrates a detailed schematic diagram 300B of the circuit 300 having the NOR SR latch circuit 220 and the POR circuit 330 with a first delay 334A, FIG. 3C illustrates another detailed schematic diagram 300C of the circuit 300 having the NOR SR latch circuit 220 and the POR circuit 330 with a second delay 334B, and FIG. 3D illustrates a detailed schematic diagram 300D of the second delay 334B in FIG. 3C.

As described in greater detail herein, the POR circuit 330 may be used for memory applications. In some cases, the POR circuit 330 may be configured to generate a pulse as an input voltage (e.g., vddpe) ramps up. This pulse may be used to pre-set or pre-reset any uninitialized latches (e.g., NOR SR latch 222) and/or flip-flops, especially, e.g., in memory periphery logic.

In reference to FIG. 3A, the circuit 300 may include the NOR SR latch circuit 220 and the POR circuit 330. The circuit 300 may be implemented as a memory circuit having the NOR SR latch 222. The POR circuit 330 may include a delay 334 (delay circuit or delay component). In some cases, the delay 334 may be configured to reset the NOR SR latch 222 to a predetermined state at power-up, which refers to a time period for activation of the circuit 300 during ramp of a supply voltage, such as, e.g., VDD.

In some implementations, the clock signal CLK may be provided to the S input of the NOR SR latch 222, and a control signal 333 may be provided from the delay 334 to the R input of the NOR SR latch 222. The delay circuit 334 may be configured to provide a delayed control signal 333 (bret) to the R input of the NOR SR latch 222, e.g., to ensure that resetting of the NOR SR latch 222 is delayed by a predetermined period of time. Further, the delay 334 may be coupled between the NOR SR latch 222 and the second voltage source VSS (e.g., the second supply bus). The second voltage source VSS may be referred to as a ground voltage or ground signal (GND).

In reference to FIG. 3B, the NOR SR latch 222 of the NOR SR latch circuit 220 includes various components, including multiple inverters and NOR gates, wherein similar components have similar functionality as described in FIG. 2B. However, in this instance, the fourth NOR gate 246B is configured to receive the output signal from the third NOR gate 244B, the Q signal from the second NOR gate 246A, and the output signal (bret) from the first delay 334A of the POR circuit 330. As shown, the output signal (bret) from the first delay 334A may be received by the NOR SR latch 222 at the R input thereof. Based on the received signals, the fourth NOR gate 246B is configured to provide an output signal to the second NOR gate 246A.

In some implementations, as shown, the first delay 334A may include a number of inverters I1, I2, I3, . . . , IN that are arranged to ensure that resetting of the NOR SR latch 222 is delayed by a predetermined period of time. For instance, the first delay 334A may include multiple inverters 360A, 360B, 360C, . . . , 360N that are arranged sequentially in series and may be configured to delay the input signal by the predetermined period of time (based, e.g., on the number of inverters). Further, as shown in FIG. 3B, the multiple inverters 360A, 360B, 360C, . . . , 360N are configured to receive the second voltage source VSS as the input signal, which may be referred to as a ground signal (GND), and then provide the output signal (bret) to the fourth NOR gate 246B of the NOR SR latch 222 via the R input thereof. In some implementations, the first delay 334A may provide an even number of inversions. For instance, the first delay 334A may include an even number of inverters, such as, e.g., four (4) or six (6). In other implementations, other types of circuit components or devices may be used (e.g., various other types of gates) to provide any number of inversions, including an even number of inversions.

Further, in some implementations, a forward biasing signal may be provided as a source supply voltage from one of the inverters (e.g., the first inverter I1) to at least one other inverter (e.g., the third inverter I3) in a manner as described above in reference to FIG. 2D. For instance, in some cases, an output voltage of the first inverter I1 may be applied to the third inverter I3 as a forward biasing voltage or signal mid1 for use as, e.g., a power supply connection. Various features related to the forward biasing voltage or signal mid1 is described in greater detail herein below.

In some implementations, as shown in reference to FIG. 3C, the second delay 334B may include multiple inverters 360A, 360B, 360C, 360D, 360E, 360F that may be arranged to reset the NOR SR latch 222 to a predetermined state at power-up. As shown, one or more of the multiple inverters 360A, 360B, 360C, 360D, 360E, 360F are arranged or configured to provide a forward biasing voltage (e.g., mid1, mid2) as a source supply voltage to at least one other inverter of the multiple inverters. For instance, in some cases, an output voltage of a sixth inverter I6 may be applied to a fourth inverter I4 as a forward biasing voltage, and an output voltage of the fourth inverter I4 may be applied to a second inverter I2 as another forward biasing voltage.

In some implementations, as shown in FIG. 3D, the multiple inverters 360A, 360B, 360C, 360D, 360E, 360F of the second delay 334B may include a plurality of transistors that are arranged to receive a ground supply voltage (log0), receive an operating supply voltage (vddpe), and provide the delayed control signal (bret) to the NOR SR latch 222 to ensure that resetting of the NOR SR latch 222 is delayed by a predetermined period of time. As shown, the plurality of transistors may include metal-oxide-semiconductor MOS transistors, including p-type MOS (PMOS) and n-type MOS (NMOS) transistors.

As shown in FIG. 3D, the multiple inverters 360A, 360B, 360C, 360D, 360E, 360F of the second delay 334B may be arranged in stages, including a first stage 336, a second stage 337, and a third stage 338. In some cases, the delay circuit 334B shown in FIG. 3D is configured to generate a pulse as the input voltage supply (e.g., vddpe) ramps-up. This pulse may be used to reset the NOR SR latch 222.

In the first stage 336, transistors P1, P2, N1 (of a first inverter I1, 360A) may be arranged to receive the log0 input, receive vddpe input, and provide the mid1 output. Further, in the first stage 336, transistors P3, N2, N3 (of a second inverter I2, 360B) may be arranged to receive the mid1 input, receive vddpe input, and provide the out1 output.

In some cases, the signal out1 is delayed so as to initially generate a high signal bret during power ramp-up. This initial high signal may be used to reset the NOR SR latch 222 and later settle to logical zero (e.g., 0V). For instance, as vddpe ramps up, mid1 lags and slowly rises up. For the second inverter I2, 360B, initially, the PMOS transistor P3 may have a larger gate-to-source voltage |Vgs| than the NMOS transistor N2. In some cases, out1 rises and then falls as the NMOS stack N2, N3 starts to turn ON. Further, a pulse may be generated at out1, which, if amplified and delayed, may be used as the POR signal to reset the NOR SR latch 222.

In the second stage 337, transistors P4, P5, N4 (of a third inverter I3, 360C) may be arranged to receive the out1 input, receive mid1 input at node n1 (as forward biasing supply voltage), and provide the mid2 output. Further, in the second stage 337, transistors P6, N5, N6 (of a fourth inverter I4, 360D) may be arranged to receive the mid2 input, receive vddpe input, and provide the out2 output.

In the third stage 338, transistors P7, P8, N7 (of a fifth inverter I5, 360E) may be arranged to receive the out2 input, receive mid2 input at node n2 (as forward biasing supply voltage), and provide the porb output. Further, in the third stage 338, transistors P9, N8, N9 (of a sixth inverter I6, 360F) may be arranged to receive the porb input, receive vddpe input, and provide the bret output.

In some cases, as vddpe ramps up, a pulse may be generated on out1. In this instance, mid2 may lag vddpe (e.g., more than mid1) as input to the third inverter I3, 260C is a pulse and not log0 (e.g., in a manner as for the first inverter I1, 360A). This may lead to amplification of a pulse at out2. Further, as shown, at node n1, mid1 is coupled to the source node of the PMOS transistor P4 of the third inverter I3, 360C. This may lead to a delay of the pulse at out2. Still further, as shown, the output signal bret may be generated, and this signal bret may serve as a POR signal to reset the NOR SR latch 222.

Figure 4:
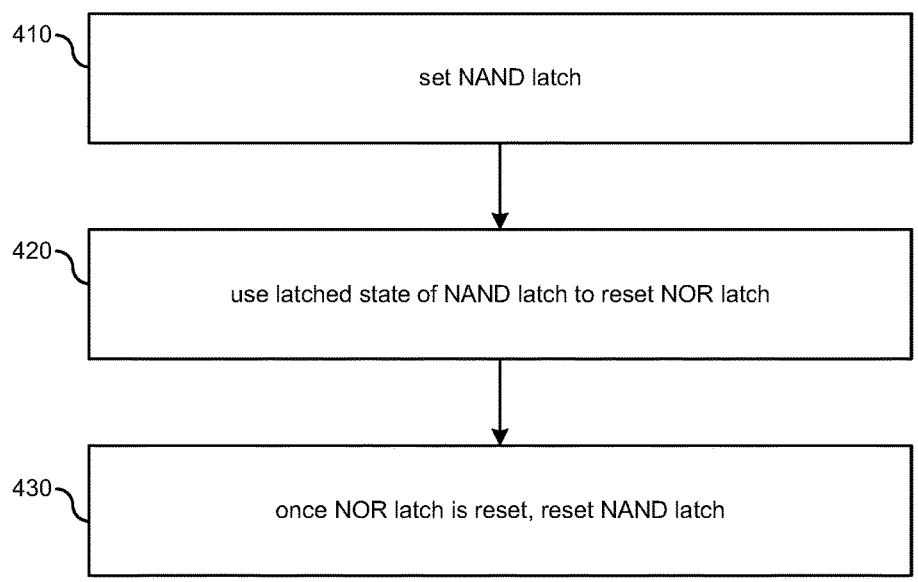
FIG. 4 illustrates a method for generating a POR reset signal in accordance with various implementations described herein.

FIG. 4 illustrates a method 400 for generating a power-on-reset (POR) reset signal in accordance with various implementations described herein.

It should be understood that even though method 400 may indicate a particular order of execution of operations, in some instances, various certain portions of the operations may be executed in a different order, and on different systems. In some other instances, additional operations or steps may be added to and/or omitted from method 400. The method 400 may be implemented in hardware and/or software. If implemented in hardware, the method 400 may be implemented with various circuit components, such as described herein above in reference to FIGS. 2A-2C. If implemented in software, the method 400 may be implemented as a program or software instruction process that may be configured to provide level shifting as described herein. Further, if implemented in software, instructions related to implementing the method 400 may be stored in memory and/or a database. For instance, a computer or various other computing devices having a processor and memory may be configured to perform method 400.

In reference to FIG. 4, at block 410, method 400 may set a NAND latch. For instance, to set a NAND latch, a logical zero (e.g., 0V input from VSS or GND) at a gate of the NAND latch is readily available at time of power-up. Hence, a fast NAND setting operation may be achieved at power-up.

At block 420, method 400 may use the latched state of the NAND latch to reset a NOR latch. For instance, since the signal used to reset the NOR latch is a latched signal (from the NAND latch), the reset operation of the NOR latch is not dependent on a pulse width generated by a forward path of the NAND latch. Thus, this particular scheme or technique may be more robust against the variability of pulse delay.

At block 430, once the NOR latch is reset, method 400 may reset the NAND latch. For instance, resetting the NAND latch may ensure that normal operation of the NOR latch is independent of a reset path. As such, in various implementations, method 400 may be used for power-on reset (POR) of one latch (such as, e.g., NAND latch) to thereby set/reset another latch (such as, e.g., NOR Latch). Further, in accordance with various implementations described herein, reference to a NOR latch may refer to a NOR SR latch, and reference to a NAND latch may refer to a NAND SR latch.

Described herein are various implementations of a circuit. The circuit may include a memory circuit having a first latch. The circuit may include a power-on-reset circuit having a second latch coupled to the first latch. The second latch may be configured to reset the first latch to a predetermined state at power-up.

Described herein are implementations of a circuit. The circuit may include a memory circuit having a first latch. The circuit may include a power-on-reset circuit having a second latch and a delay circuit arranged to reset the first latch to a predetermined state at power-up.

Described herein are various implementations of a circuit. The circuit may include a memory circuit having a latch. The circuit may include a power-on-reset circuit having a delay circuit coupled to the latch. The delay circuit may include multiple inverters that are configured to reset the latch to a predetermined state at power-up. One or more inverters of the multiple inverters may be arranged to provide a forward biasing voltage as a source supply voltage to at least one other inverter of the multiple inverters.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A circuit comprising:
a memory circuit having a first latch; and
a power-on-reset circuit having a second latch coupled to the first latch,
wherein the second latch is configured to reset the first latch to a predetermined state at power-up,
wherein the second latch comprises a NAND SR latch that receives a first Q signal from the first latch and provides a second Q signal to the first latch, and
wherein the power-on-reset circuit further comprises a delay circuit that provides a signal to a power supply connection of the NAND SR latch to delay resetting of the NAND SR latch.

2. The circuit of claim 1, wherein the first latch comprises a NOR SR latch.

3. The circuit of claim 2, wherein a clock signal is provided to an S input of the NOR SR latch, and wherein a control signal is provided from the second latch to an R input of the NOR SR latch.

4. The circuit of claim 3, wherein the control signal comprises the second Q signal from the NAND SR latch.

5. The circuit of claim 4, wherein the NOR SR latch provides the first Q signal to a first input of the NAND SR latch as a handshake signal to indicate that the NOR SR latch is reset.

6. The circuit of claim 4, wherein the delay circuit provides the signal to a second input of the NAND SR latch and also to the power supply connection of the NAND SR latch to delay resetting of the NAND SR latch by a predetermined period of time.

7. The circuit of claim 6, wherein the delay circuit comprises a resistor, a capacitor, and multiple gates arranged to delay resetting of the NAND SR latch by the predetermined period of time.

8. The circuit of claim 6, wherein the delay circuit comprises multiple inverters arranged to ensure that resetting of the NAND SR latch is delayed by the predetermined period of time, and wherein one or more inverters of the multiple inverters are arranged to provide a forward biasing voltage as a source supply voltage to at least one other inverter of the multiple inverters.

9. The circuit of claim 1, wherein power-up refers to a time period for activation of the circuit during ramp of a supply voltage.

10. A circuit comprising:
a memory circuit having a first latch; and
a power-on-reset circuit having a second latch and a delay circuit,
wherein the power-on-reset circuit resets the first latch to a predetermined state at power-up, wherein the second latch comprises a NAND SR latch having at least one NAND gate, wherein the NAND SR latch receives a first Q signal from the first latch and provides a second Q signal to the first latch, and wherein the delay circuit provides a signal to a power supply connection of the at least one NAND gate of the NAND SR latch to delay resetting of the NAND SR latch.

11. The circuit of claim 10, wherein the delay circuit comprises a resistor, a capacitor, and multiple gates arranged to delay resetting of the second latch by a predetermined period of time.

12. The circuit of claim 10, wherein the delay circuit comprises multiple inverters arranged to ensure that resetting of the second latch is delayed by a predetermined period of time, and wherein one or more inverters of the multiple inverters are arranged to provide a forward biasing voltage as a source supply voltage to at least one other inverter of the multiple inverters.

13. The circuit of claim 10, wherein the first latch comprises a NOR SR latch.

14. The circuit of claim 13, wherein a clock signal is provided to an S input of the NOR SR latch, and wherein the second Q signal is provided from the NAND SR latch to an R input of the NOR SR latch.

15. The circuit of claim 14, wherein the NOR SR latch provides the first Q signal to a first input of the NAND SR latch as a handshake signal to indicate when the NOR SR latch is reset.

16. The circuit of claim 14, wherein the delay circuit provides the signal to a second input of the NAND SR latch and also to the power supply connection of the at least one NAND gate of the NAND SR latch to delay resetting of the NAND SR latch by a predetermined period of time.

* * * * *